(12) United States Patent
Tsukuda et al.

(10) Patent No.: US 12,040,399 B2
(45) Date of Patent: Jul. 16, 2024

(54) SEMICONDUCTOR DEVICE

(71) Applicant: RENESAS ELECTRONICS CORPORATION, Tokyo (JP)

(72) Inventors: Eiji Tsukuda, Tokyo (JP); Tohru Kawai, Tokyo (JP); Atsushi Amo, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 191 days.

(21) Appl. No.: 17/697,393

(22) Filed: Mar. 17, 2022

(65) Prior Publication Data
US 2023/0299197 A1 Sep. 21, 2023

(51) Int. Cl.
*H01L 29/51* (2006.01)
*H01L 29/78* (2006.01)

(52) U.S. Cl.
CPC ...... *H01L 29/78391* (2014.09); *H01L 29/516* (2013.01)

(58) Field of Classification Search
CPC .................. H01L 29/78391; H01L 29/516
USPC ...................................................... 257/295
See application file for complete search history.

(56) References Cited

U.S. PATENT DOCUMENTS

| | | | |
|---|---|---|---|
| 2006/0081939 A1* | 4/2006 | Akasaka | H01L 29/517 257/E21.639 |
| 2007/0132003 A1* | 6/2007 | Takashima | H10B 41/30 438/257 |
| 2008/0054344 A1* | 3/2008 | Nam | H01L 29/42324 257/E21.422 |
| 2008/0061333 A1* | 3/2008 | Hidaka | H10B 53/00 257/295 |
| 2009/0134465 A1* | 5/2009 | Shimizu | H01L 21/28088 438/584 |
| 2009/0242963 A1* | 10/2009 | Shingu | H01L 21/02263 257/E21.409 |
| 2009/0242970 A1* | 10/2009 | Shimizu | H01L 29/40114 257/632 |
| 2009/0294830 A1* | 12/2009 | Forbes | H10B 41/30 257/E29.304 |
| 2010/0213532 A1* | 8/2010 | Kamata | H01L 29/517 257/369 |
| 2010/0224916 A1* | 9/2010 | Shimizu | H01L 29/518 257/532 |
| 2013/0140616 A1* | 6/2013 | Schulze | H01L 27/0251 257/296 |

(Continued)

FOREIGN PATENT DOCUMENTS

JP 2009-135140 A 6/2009

*Primary Examiner* — Sheikh Maruf
(74) *Attorney, Agent, or Firm* — Rimon P.C.

(57) ABSTRACT

A semiconductor device is provided with an SOI substrate which includes a semiconductor substrate, a ferroelectric layer and a semiconductor layer, and has a first region in which a first MISFET is formed. The first MISFET includes: the semiconductor substrate in the first region; the ferroelectric layer in the first region; the semiconductor layer in the first region; a first gate insulating film formed on the semiconductor layer in the first region; a first gate electrode formed on the first gate insulating film; a first source region located on one side of the first gate electrode and formed in the semiconductor layer in the first region; and a first drain region located on the other side of the first gate electrode and formed in the semiconductor layer in the first region.

12 Claims, 11 Drawing Sheets

(56) References Cited

U.S. PATENT DOCUMENTS

| | | | |
|---|---|---|---|
| 2013/0161713 A1* | 6/2013 | Yamazaki | H10B 12/036 |
| | | | 257/296 |
| 2013/0320334 A1* | 12/2013 | Yamazaki | H01L 29/42356 |
| | | | 257/43 |
| 2015/0070964 A1* | 3/2015 | Yamada | H01L 29/78391 |
| | | | 257/295 |
| 2016/0027782 A1* | 1/2016 | Saito | H01L 28/60 |
| | | | 257/43 |
| 2016/0156350 A1* | 6/2016 | Tsuchiya | H03K 17/6872 |
| | | | 327/537 |
| 2020/0211909 A1* | 7/2020 | Tsuda | H01L 29/66545 |
| 2022/0059669 A1* | 2/2022 | Tomida | H01L 29/517 |

* cited by examiner

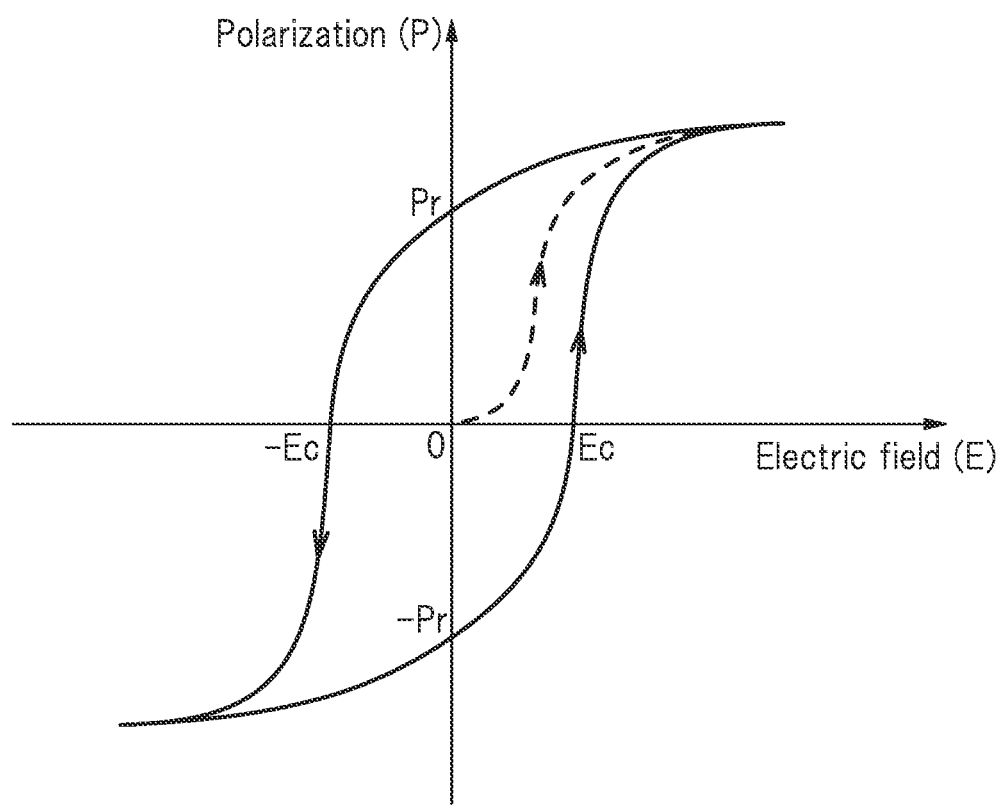

SEMICONDUCTOR DEVICE

BACKGROUND

The present invention relates to a semiconductor device, and relates to, for example, a semiconductor device including an SOI substrate.

As a semiconductor device intended for low power consumption, a technique of forming a MISFET (Metal Insulator Semiconductor Field Effect Transistor) on an SOI (Silicon On Insulator) substrate having a semiconductor substrate, an insulating layer formed on the semiconductor substrate, and a silicon layer formed on the insulating layer has been known. The MISFET formed on the SOI substrate can reduce the parasitic capacitance caused by the diffusion region formed in the silicon layer. Therefore, it is possible to achieve the improvement in the operating speed and the reduction in the power consumption of the MISFET.

Here, there are disclosed techniques listed below.
[Patent Document 1] US Patent Application Publication No. 2016/0156350 (Japanese Unexamined Patent Application Publication No. 2009-135140)

Patent Document 1 discloses a technique of forming a MISFET for a logic circuit designed for high-speed operation and a MISFET for a memory circuit designed for stable operation on an SOI substrate. Further, in this document, in order to form these MISFETs, a technique of making the configurations of the impurity regions formed in the semiconductor substrate immediately below the respective insulating layers different from each other and a technique of controlling back gate voltage applied to the impurity regions are disclosed.

SUMMARY

A plurality of MISFETs used for different purposes is formed in various regions of the SOI substrate, for example, a plurality of MISFETs having different threshold voltages is formed. In order to adjust the threshold voltage, a method of changing the impurity concentration in the channel region or around the channel region is usually performed. Therefore, it is necessary to increase the number of masks in order to change the impurity concentration, which causes a problem of the increase in manufacturing cost.

Also, in the MISFET of the SOI substrate, the back gate voltage is also used to control the threshold voltage. Accordingly, it is necessary to provide a control circuit for the back gate voltage and a power feeding region for applying the back gate voltage. Therefore, the region for constituting them becomes necessary, which causes a problem that the miniaturization of the semiconductor device becomes difficult.

Other problems and novel features will become apparent from the descriptions of this specification and accompanying drawings.

A semiconductor device according to an embodiment includes an SOI substrate including a semiconductor substrate, a ferroelectric layer formed on the semiconductor substrate, and a semiconductor layer formed on the ferroelectric layer, and having a first region in which a first MISFET is formed. Here, the first MISFET includes: the semiconductor substrate in the first region; the ferroelectric layer in the first region; the semiconductor layer in the first region; a first gate insulating film formed on the semiconductor layer in the first region; a first gate electrode formed on the first gate insulating film; a first source region located on one side of the first gate electrode and formed in the semiconductor layer in the first region; and a first drain region located on the other side of the first gate electrode and formed in the semiconductor layer in the first region.

BRIEF DESCRIPTIONS OF THE DRAWINGS

FIG. 2 is a table showing applied voltages in the first embodiment.

FIG. 3 is a graph showing a relationship between an intensity of electric field and a magnitude of polarization in a ferroelectric layer.

DETAILED DESCRIPTION

Figure 1:
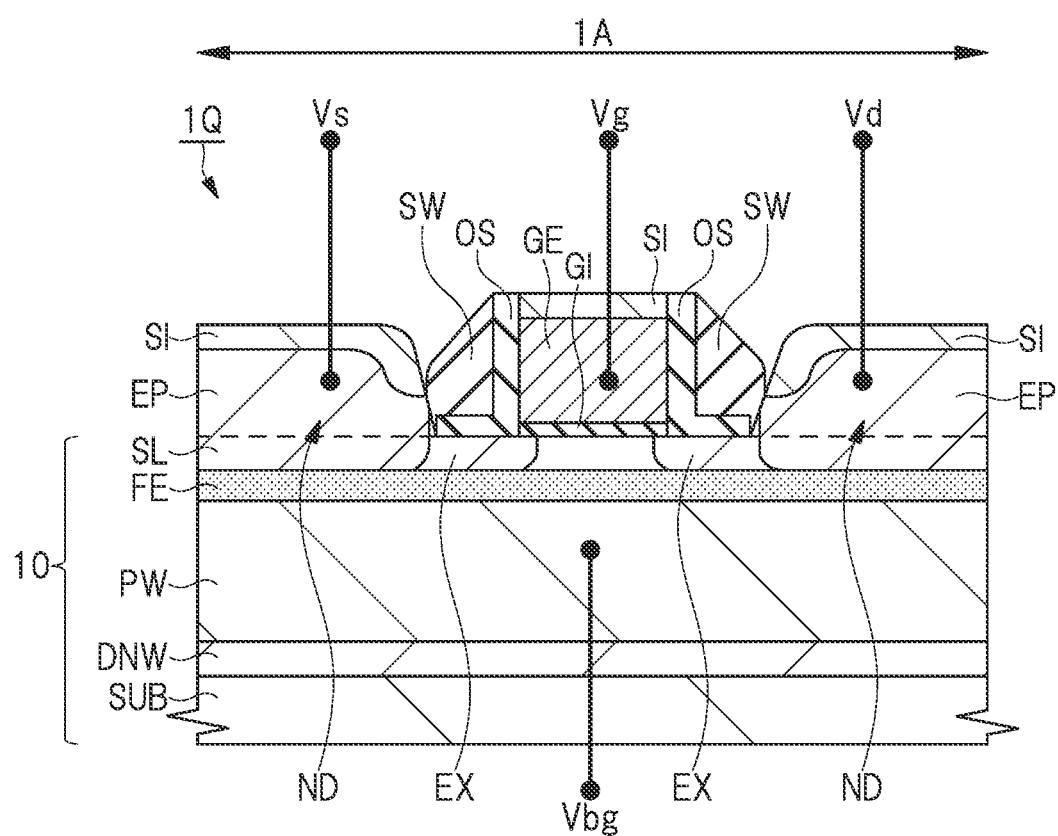
FIG. 1 is a cross-sectional view showing a semiconductor device according to the first embodiment.

Hereinafter, embodiments will be described in detail with reference to the drawings. Note that members having the same function are denoted by the same reference characters throughout the drawings for describing the embodiments and the repetitive description thereof will be omitted. Also, in the following embodiments, descriptions of the same or similar parts are not repeated in principle unless particularly required.

First Embodiment

<Structure of Semiconductor Device>

A semiconductor device according to the first embodiment will be described below with reference to FIG. 1 to FIG. 4.

As shown in FIG. 1, the semiconductor device includes an SOI substrate 10 having a semiconductor substrate SUB, a ferroelectric layer FE formed on the semiconductor substrate SUB, and a semiconductor layer SL formed on the ferroelectric layer FE. Further, the SOI substrate 10 has a region 1A in which a MISFET 1Q which is a semiconductor element is formed. As will be described later, the SOI substrate 10 also has a region in which another semiconductor element is formed, such as a region 2A different from the region 1A. Here, an n-type MISFET 1Q is presented as an example of the semiconductor element formed in the region 1A.

The semiconductor substrate SUB is made of p-type single crystal silicon having a specific resistance of about 1 Ωcm to 10 Ωcm. The semiconductor layer SL is made of single crystal silicon having a specific resistance of about 1 Ωcm to 10 Ωcm, and the thickness of the semiconductor layer SL is, for example, about 10 nm to 20 nm. Note that the semiconductor layer SL is an intrinsic semiconductor layer in which an n-type or p-type impurity is not introduced. Even if a p-type impurity is introduced into the semiconductor layer SL, the impurity concentration thereof is $1\times10^{13}/cm^3$ or less.

The ferroelectric layer FE is an insulating layer (HZO layer) made of a material containing, for example, hafnium (Hf), oxygen (O), and zirconium (Zr) as the first element. More specifically, the ferroelectric layer FE is composed of $Hf_{0.5}Zr_{0.5}O_2$. Also, the ferroelectric layer FE is an orthorhombic crystal. The thickness of the ferroelectric layer FE is, for example, about 4 nm to 15 nm. Hereinafter, the case where the ferroelectric layer FE is an HZO layer will be described as a representative example, but the above-mentioned first element may be any one of silicon (Si), germanium (Ge), yttrium (Y), lanthanum (La), and ytterbium (Yb) instead of zirconium.

An n-type well region DNW is formed in the semiconductor substrate SUB, and a p-type well region PW is formed in the well region DNW. The well region PW is electrically separated from the p-type semiconductor substrate SUB by this well region DNW.

A gate insulating film GI is formed on the semiconductor layer SL in the region 1A, and a gate electrode GE is formed on the gate insulating film GI. Here, the gate insulating film GI is composed of a single-layer film made of an insulating film such as a silicon oxide film or a stacked film having a silicon oxide film and a high dielectric constant film containing hafnium, aluminum, or the like. Further, the gate electrode GE is composed of a single-layer film made of a conductive film such as a polycrystalline silicon film or a stacked film having a polycrystalline silicon film and a metal film containing titanium nitride, tungsten or the like. The thickness of the gate insulating film GI is, for example, 2 nm to 3 nm, and the thickness of the gate electrode GE is, for example, 60 nm to 100 nm.

Sidewall spacers SW are formed on both side surfaces of the gate electrode GE via offset spacers OS. An extension region EX which is a low-concentration n-type impurity region is formed in the semiconductor layer SL below the offset spacer OS and the sidewall spacer SW. Further, an epitaxial layer EP is formed on a part of the semiconductor layer SL. A diffusion region ND which is an n-type impurity region having a higher concentration than the extension region EX is formed in the epitaxial layer EP and the semiconductor layer SL.

These extension region EX and diffusion region ND constitute a source region or a drain region of the MISFET 1Q. Namely, the extension region EX and the diffusion region ND located on one side of the gate electrode GE constitute the source region of the MISFET 1Q, and the extension region EX and the diffusion region ND located on the other side of the gate electrode GE constitute the drain region of the MISFET 1Q. As shown in FIG. 1, the diffusion region ND is composed of the epitaxial layer EP and the semiconductor layer SL.

A silicide layer SI is formed on the gate electrode GE and the diffusion region ND. The silicide layer SI is made of, for example, nickel silicide (NiSi) or cobalt silicide ($CoSi_2$).

The MISFET 1Q is configured by including the semiconductor substrate SUB in the region 1A, the ferroelectric layer FE in the region 1A, the semiconductor layer SL in the region 1A, the gate insulating film GI, the gate electrode GE, the source region and the drain region each composed of the extension region EX and the diffusion region ND, and the silicide layer SI.

Although not shown, an interlayer insulating film is formed on the main surface in the region 1A so as to cover the MISFET 1Q. A plurality of contact holes is formed in the interlayer insulating film, and a plurality of plugs is formed by filling the plurality of contact holes with a conductive film mainly made of tungsten or the like. Each plug is electrically connected to the gate electrode GE and the diffusion region ND via the silicide layer SI. A plurality of wirings electrically connected to each plug is formed on the interlayer insulating film. Predetermined voltages are applied to the gate electrode GE, the source region, and the drain region of the MISFET 1Q via these wirings and plugs.

Studied Example

Figure 15:
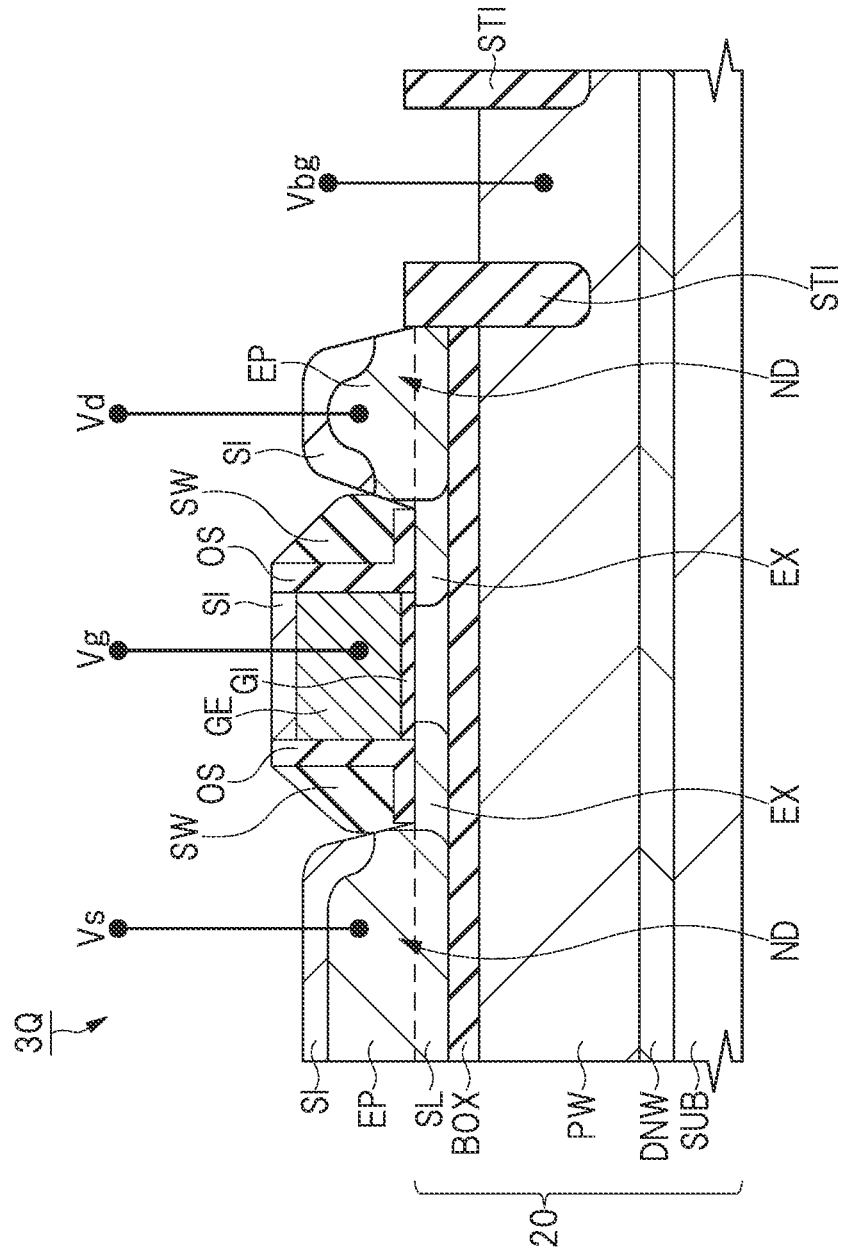
FIG. 15 is a cross-sectional view showing a semiconductor device according to a studied example.

FIG. 15 shows a semiconductor device in an example studied by the inventors of this application (studied example). Unlike the ferroelectric layer FE of the SOI substrate 10 in the first embodiment, an SOI substrate 20 of the studied example has an insulating layer BOX, and a MISFET 3Q is formed on the SOI substrate 20. The structure of the MISFET 3Q is the same as that of the MISFET 1Q of the first embodiment except for the insulating layer BOX.

In the on-operation and off-operation of the MISFET 3Q of the studied example, the gate voltage Vg is applied to the gate electrode GE, the source voltage Vs is applied to the source region, and the drain voltage Vd is applied to the drain region. Further, the back gate voltage Vbg is applied to the well region PW from the power feeding region. The power feeding region is a region where the semiconductor layer SL and the insulating layer BOX are removed and the semiconductor substrate SUB is exposed. By arranging the plug also in this power feeding region, the back gate voltage Vbg is applied to the well region PW via the plug.

The threshold voltage of the MISFET 3Q in the studied example may be adjusted also by the adjustment of the impurity concentration of the surface of the well region PW, but it is mainly adjusted by controlling the back gate voltage Vbg.

Now consider the case of forming a plurality of MISFETs having different threshold voltages in various regions of the SOI substrate 20 on the assumption that they are used for different purposes. In that case, in order to change the impurity concentration in the channel region or around the channel region, it is necessary to increase the number of masks, which causes a problem of the increase in manufacturing cost. Also, it is necessary to provide a control circuit for the back gate voltage and a power feeding region for applying the back gate voltage, which causes a problem that the miniaturization of the semiconductor device becomes difficult.

In consideration of such various problems, the inventors of this application have devised a method of providing a plurality of MISFETs having different threshold voltages without depending on the back gate voltage Vbg. The main feature of the method is to apply the ferroelectric layer FE instead of the insulating layer BOX and to adjust the threshold voltage of the MISFET by changing the magnitude of the polarization of the ferroelectric layer FE.

<Method of Adjusting Threshold Voltage in First Embodiment>

FIG. 2 shows applied voltages in each operation of the MISFET 1Q in the first embodiment. The gate voltage Vg is applied to the gate electrode GE, the source voltage Vs is applied to the source region, and the drain voltage Vd is applied to the drain region. Further, the back gate voltage Vbg is applied to the well region PW from the power feeding region. Although not shown in FIG. 1, the SOI substrate 10 of the first embodiment is also provided with the feeding region similar to that of the studied example.

Note that it is not always necessary to apply the back gate voltage Vbg to the well region PW at all times in each operation, but if the well region PW is brought into a floating state, there is a risk that an unintended malfunction may occur in the MISFET 1Q due to a charged charge or the like. Therefore, as shown in FIG. 2, the back gate voltage Vbg is fixed at the reference potential (0 V).

FIG. 3 is a graph showing the intensity of the electric field received by the ferroelectric layer FE and the magnitude of the polarization held in the ferroelectric layer FE when the respective voltages shown in the positive electric field operation and the negative electric field operation of FIG. 2 are applied to the MISFET 1Q.

In the ferroelectric layer FE, the following features are mainly known. First, the relative permittivity thereof changes greatly depending on the external electric field (E). Next, even if the external electric field (E) becomes zero, the polarization (P) is held in the ferroelectric layer FE. Further, the magnitude of the polarization (P) differs depending on how the external electric field (E) changes (history). These features are shown by the graph referred to as a hysteresis loop shown in FIG. 3.

First, as shown by the broken line in FIG. 3, a positive external electric field is applied from the state where the external electric field (E) is not applied to the ferroelectric layer FE and the magnitude of the polarization (P) is zero. When the external electric field is gradually strengthened from zero, the positive polarization rises slightly at first and begins to rise sharply at a certain electric field value. As the positive external electric field is further strengthened, the positive polarization saturates at a constant value. After confirming that the positive polarization is likely to saturate, the positive external electric field is weakened to make the external electric field zero. Then, the positive polarization remains as a positive residual polarization (Pr) at a point slightly lower than the maximum value. This residual polarization (Pr) is the magnitude of the polarization held in the ferroelectric layer FE.

Note that the ferroelectric layer FE that has once held the polarization does not follow the path of the broken line in FIG. 3 afterward, but follows the hysteresis loop of the solid line in FIG. 3. Namely, in the ferroelectric layer FE, the following changes in polarization occur.

When a negative external electric field is applied from the state where the external electric field (E) is zero and the positive residual polarization (Pr) is held in the ferroelectric layer FE, the polarization begins to decrease. The polarization hardly decreases at first, but begins to decrease sharply at a certain electric field value. Then, when the negative external electric field reaches a certain intensity (coercive electric field −Ec), the polarization becomes zero. When the negative external electric field is further strengthened, the negative polarization saturates at a constant value. After confirming that the negative polarization is likely to saturate, the negative external electric field is weakened to make the external electric field zero. Then, the negative polarization remains as a negative residual polarization (−Pr) at a point slightly higher than the maximum value. This residual polarization (−Pr) is the magnitude of the polarization held in the ferroelectric layer FE.

When a positive external electric field is applied from the state where the external electric field (E) is zero and a negative residual polarization (−Pr) is held in the ferroelectric layer FE, the polarization begins to rise. The polarization hardly rises at first, but begins to rise sharply at a certain electric field value. Then, when the positive external electric field reaches a certain intensity (coercive electric field Ec), the polarization becomes zero. When the positive external electric field is further strengthened, the positive polarization saturates at a constant value. After confirming that the positive polarization is likely to saturate, the positive external electric field is weakened to make the external electric field zero. Then, the positive polarization remains as a positive residual polarization (Pr) at a point slightly lower than the maximum value. This residual polarization (Pr) is also the magnitude of the polarization held in the ferroelectric layer FE.

In the first embodiment, as shown in "positive electric field operation" in FIG. 2, the same positive electric field voltage (2 V) is applied to the gate electrode GE, the source region, and the drain region of the MISFET 1Q, so that a positive electric field is generated in the semiconductor layer SL in the region 1A and a positive electric field is generated at least in the semiconductor layer SL located immediately below the gate electrode GE. This electric field functions as the external electric field for the ferroelectric layer FE. Therefore, the magnitude of the polarization held in the ferroelectric layer FE located immediately below the gate electrode GE can be changed. Namely, the ferroelectric layer FE is configured such that the magnitude of the polarization held in the ferroelectric layer FE is changed by applying the same positive electric field voltage to the gate electrode GE, the source region, and the drain region. Here, positive residual polarization (Pr) is held in the ferroelectric layer FE.

On the other hand, as shown in "negative electric field operation" in FIG. 2, the same negative electric field voltage (−2 V) is applied to the gate electrode GE, the source region, and the drain region of the MISFET 1Q, so that a negative electric field is generated in the semiconductor layer SL in the region 1A and a negative electric field is generated at least in the semiconductor layer SL located immediately below the gate electrode GE. This electric field functions as the external electric field for the ferroelectric layer FE. Therefore, the magnitude of the polarization held in the ferroelectric layer FE located immediately below the gate electrode GE can be changed. Namely, the ferroelectric layer FE is configured such that the magnitude of the polarization held in the ferroelectric layer FE is changed by applying the same negative electric field voltage to the gate electrode GE, the source region, and the drain region. Here, negative residual polarization (−Pr) is held in the ferroelectric layer FE.

Note that "immediately below the gate electrode GE" mentioned here means the region located below the gate electrode GE, and includes the region which is not in direct contact with the gate electrode GE as in the relationship between the gate electrode GE and the semiconductor layer SL. Further, "the semiconductor layer SL located immediately below the gate electrode GE" can be restated as "the semiconductor layer SL overlapped with the gate electrode GE in plan view".

Also, the threshold voltage of the MISFET 1Q can be adjusted by the magnitude of the polarization held in the ferroelectric layer FE in the region 1A. Namely, the ferroelectric layer FE in the region 1A is configured such that the threshold voltage of the MISFET 1Q is changed depending on the magnitude of the polarization held in the ferroelectric layer FE. Specifically, the threshold voltage becomes low in the MISFET 1Q that has been subjected to the "negative electric field operation" of FIG. 2, and the threshold voltage becomes high in the MISFET 10 that has been subjected to the "positive electric field operation" of FIG. 2. In the experiments conducted by the inventors of this application, it was found that a difference of about 0.2 V occurred between these threshold voltages.

Figure 4:
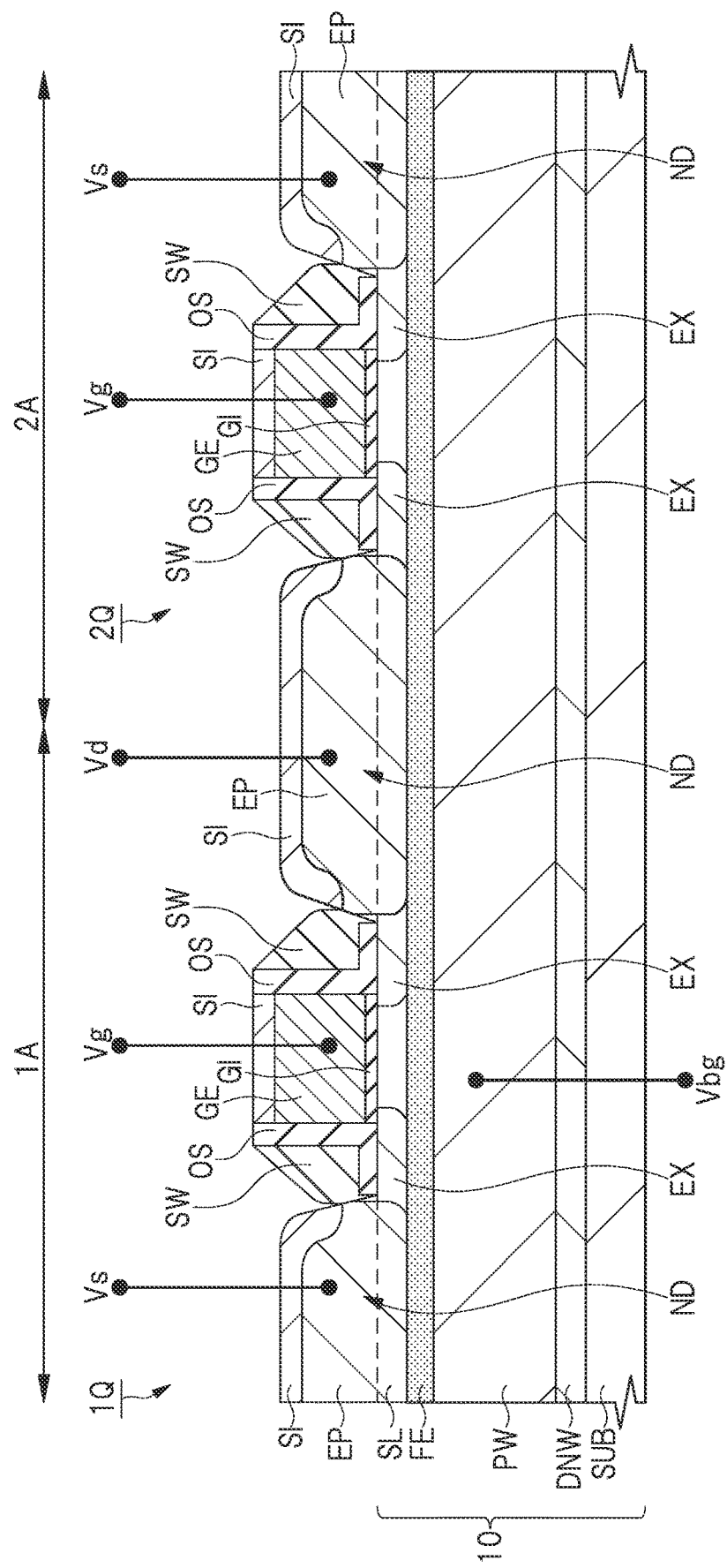
FIG. 4 is a cross-sectional view showing the semiconductor device according to the first embodiment.

FIG. 4 shows the state where a MISFET 2Q is formed in the region 2A different from the region 1A. Here, a case where each drain region (drain voltage Vd) of the MISFETs 1Q and 2Q is shared is illustrated. The configuration included in the MISFET 2Q is the same as the configuration included in the MISFET 1Q, except that the region 2A is different from the region 1A.

The threshold voltage of the MISFET 2Q can be adjusted by the magnitude of the polarization held in the ferroelectric layer FE in the region 2A. Also, although the ferroelectric layer FE is physically connected over the region 1A and the region 2A, the change in the magnitude of the polarization mainly occurs in a region where the strong electric field is concentrated such as immediately below the gate electrode GE. Therefore, the magnitudes of the polarizations held in the regions 1A and 2A do not interfere with each other. Namely, it is possible to individually set the magnitude of the polarization held in the ferroelectric layer FE in the region 1A and the magnitude of the polarization held in the ferroelectric layer FE in the region 2A. In other words, the magnitude of the polarization of the ferroelectric layer FE can be set locally.

Therefore, the threshold voltage can be adjusted individually in the MISFETs 1Q and 2Q. For example, the magnitude of the polarization held in the ferroelectric layer FE in the region 1A may be set to be different from the magnitude of the polarization held in the ferroelectric layer FE in the region 2A. This makes it possible to form a plurality of MISFETs having different threshold voltages such as MISFETs 1Q and 2Q on the same SOI substrate 10.

For example, when the MISFET 1Q is subjected to "negative electric field operation" and the MISFET 2Q is subjected to "positive electric field operation", the same gate voltage Vg, the same source voltage Vs, and the same drain voltage Vd are applied to each gate electrode GE, each source region, and each drain region in the on-operation and the off-operation of the MISFETs 1Q and 2Q as shown in FIG. 2. However, since the threshold voltages of the MISFETs 1Q and 2Q are different, the behaviors of the MISFET 1Q and 2Q are different. By utilizing such a difference, for example, the MISFET 1Q having a high threshold voltage can be used as an element intended for low power consumption with a small leakage current, and the MISFET 2Q having a low threshold voltage can be used as an element intended for high-speed operation. As described above, according to the first embodiment, it is possible to provide elements applicable to various purposes.

In the MISFETs 1Q and 2Q described above, it is not necessary to adjust the impurity concentration of the surface of the well region PW in order to adjust each threshold voltage, and control by the back gate voltage Vbg is not required. Further, each threshold voltage can be adjusted by setting in advance the magnitudes of the gate voltage Vg, the source voltage Vs, and the drain voltage Vd in the positive electric field operation and the negative electric field operation. Therefore, as compared with the studied example of FIG. 15, it is not necessary to generate a plurality of back gate voltages Vbg in order to prepare a plurality of MISFETs having different threshold voltages, and the problem that the control circuit for the back gate voltage Vbg becomes complicated does not occur. Further, the problem of the increase in the layout area of the power feeding region for applying the back gate voltage Vbg does not occur. Therefore, according to the first embodiment, the semiconductor device can be miniaturized.

Although the case of two types of threshold voltages such as those of the MISFETs 1Q and 2Q has been described in the first embodiment, it is also possible to prepare a plurality of MISFETs having three or more types of threshold voltages. For example, in the hysteresis loop in FIG. 3, by setting the external electric field to zero before the polarization saturates, it is possible to make the ferroelectric layer FE hold the residual polarization different from the residual polarization (Pr) or the residual polarization (−Pr). Thereby, it is also possible to prepare a MISFET having a threshold voltage different from those of the MISFETs 1Q and 2Q.

<Method of Manufacturing Semiconductor Device>

Figure 5:
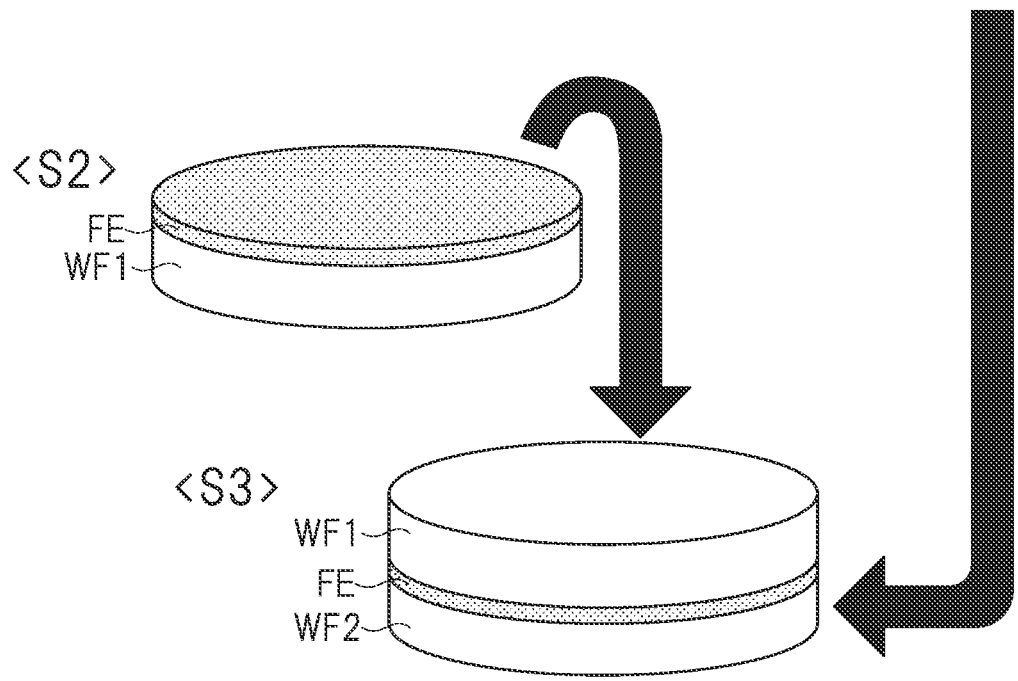
FIG. 5 is a perspective view showing a step of preparing an SOI substrate according to the first embodiment.

Hereinafter, a method of manufacturing a semiconductor device according to the first embodiment will be described with reference to FIG. 5 to FIG. 11. FIG. 5 shows a process for preparing the SOI substrate 10 used in the first embodiment in detail. FIG. 6 to FIG. 11 show the process for manufacturing the MISFET 1Q using the SOI substrate 10.

As shown in FIG. 5, in step S1, a wafer WF1 and a wafer WF2 made of single crystal silicon are prepared. In step S2, the ferroelectric layer FE is formed on the surface of the wafer WF1. The ferroelectric layer FE can be formed by, for example, the ALD method. In this state, the ferroelectric layer FE is formed as an amorphous layer.

Next, in step S3, the wafer WF1 is inverted, and the surface of the wafer WF2 and the surface of the wafer WF1 are bonded via the ferroelectric layer FE. In step S4, the wafer WF1 is ground such that a part of the wafer WF1 is left in the state of being bonded to the ferroelectric layer FE. As a result, the SOI substrate 10 in which the wafer WF2 serves as the semiconductor substrate SUB and a part of the remaining wafer WF1 serves as the semiconductor layer SL is manufactured.

Thereafter, by performing the heat treatment at 600° C. to 800° C. to the ferroelectric layer FE which is an amorphous layer, the ferroelectric layer FE becomes an orthorhombic crystal and is formed as an insulating film having ferroelectricity. Note that this heat treatment does not have to be performed at this stage, and may be performed during the manufacturing process of the MISFET 1Q described later.

Figure 6:
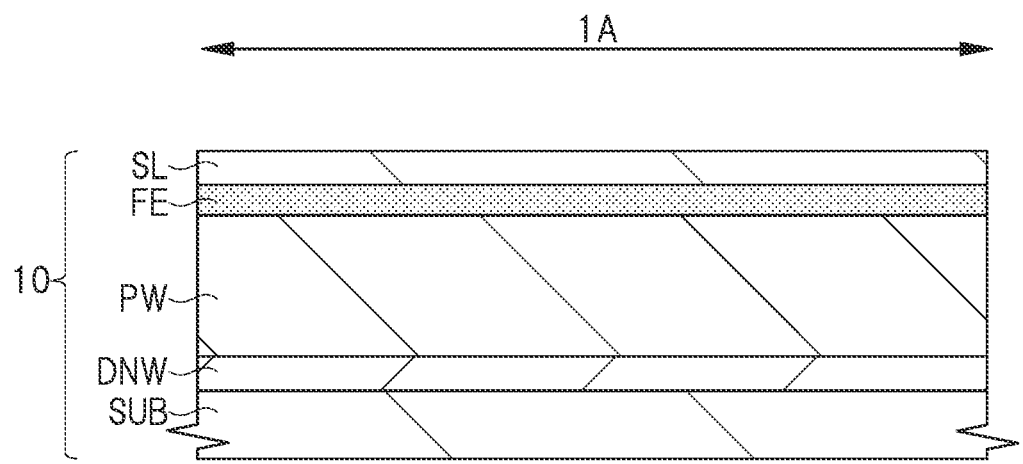
FIG. 6 is a cross-sectional view showing a manufacturing process of the semiconductor device according to the first embodiment.

As shown in FIG. 6, first, the SOI substrate 10 manufactured in steps S1 to S4 of FIG. 5 is prepared. Next, the n-type well region DNW and the p-type well region PW are sequentially formed in the semiconductor substrate SUB by the photolithography method and the ion implantation method.

Although not shown here, an element isolation portion STI is formed before the ion implantation is performed. In order to form the element isolation portion STI, first, a trench penetrating the semiconductor layer SL and the ferroelectric layer FE is formed such that the bottom portion thereof is located in the semiconductor substrate SUB. Next, an insulating film made of, for example, a silicon oxide film is formed on the semiconductor layer SL including the inside of the trench by, for example, the CVD method. Next, the insulating film outside the trench is polished by the CMP method to embed the insulating film in the trench. The element isolation portion STI is configured by the trench and the embedded insulating film.

Also, although not shown here, the power feeding region for applying the back gate voltage Vbg to the well region PW is also formed. By the photolithography method and the dry etching process, the semiconductor layer SL and the ferroelectric layer FE to be the power feeding region are sequentially removed to expose the semiconductor substrate SUB.

Figure 7:
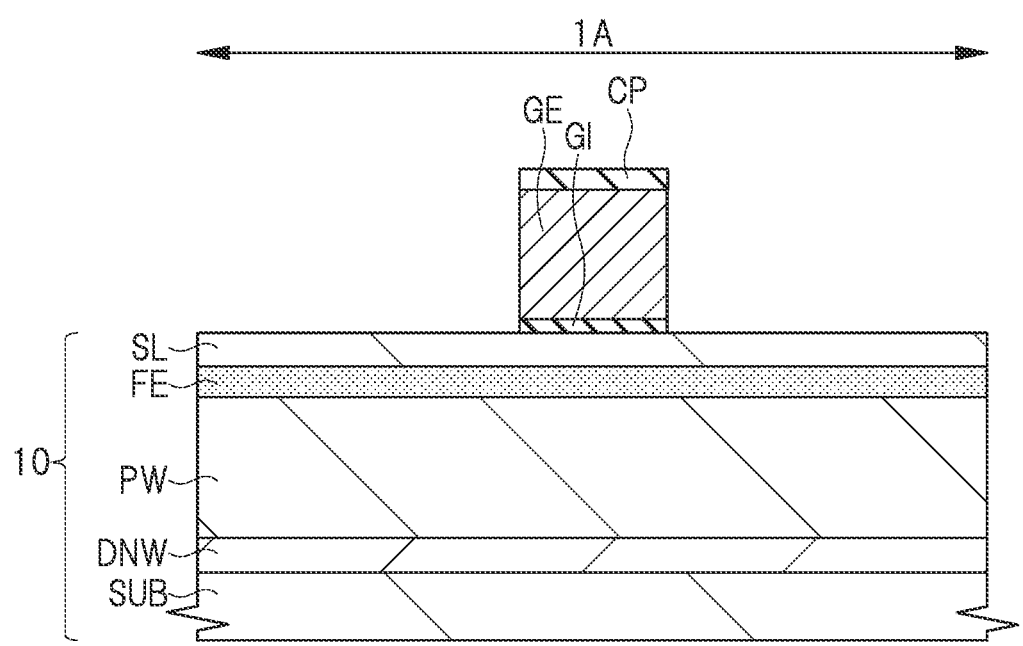
FIG. 7 is a cross-sectional view showing the manufacturing process subsequent to FIG. 6.

As shown in FIG. 7, the gate insulating film GI, the gate electrode GE, and the cap film CP are formed on the semiconductor layer SL. First, an insulating film made of, for example, a silicon oxide film is formed on the semiconductor layer SL by, for example, the thermal oxidation method. Next, a conductive film made of, for example, a polycrystalline silicon film is formed on the insulating film by, for example, the CVD method. Next, a silicon nitride film is formed on the conductive film by, for example, the CVD method.

Next, the silicon nitride film, the conductive film, and the insulating film are patterned by the photolithography method and the dry etching process. As a result, the gate insulating film GI made of the insulating film, the gate electrode GE made of the conductive film, and the cap film CP made of the silicon nitride film are formed. Note that the thickness of the cap film CP is, for example, 30 nm to 100 nm.

Figure 8:
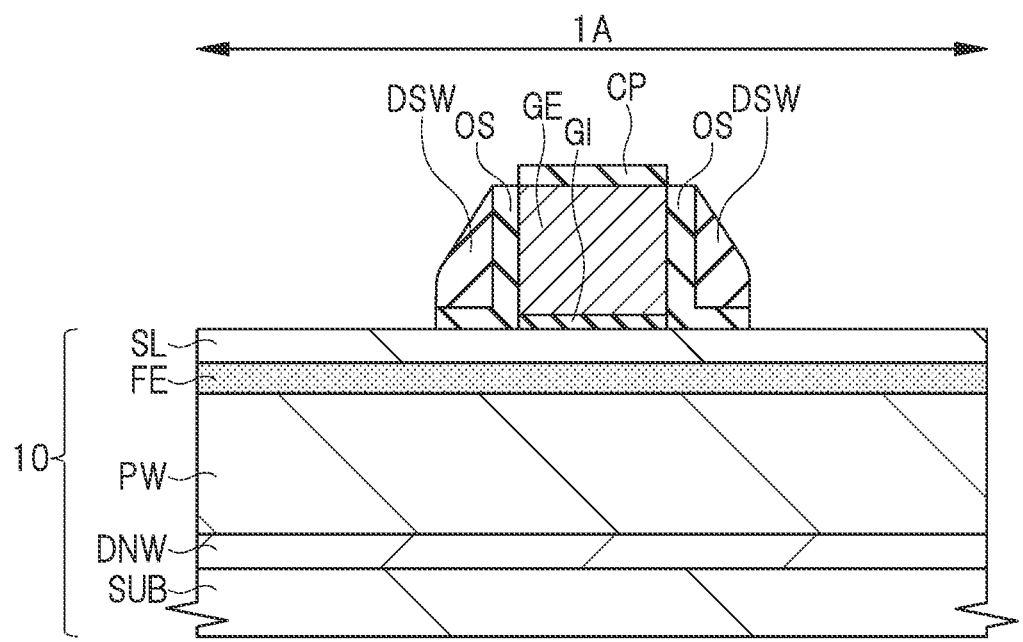
FIG. 8 is a cross-sectional view showing the manufacturing process subsequent to FIG. 7.

As shown in FIG. 8, the offset spacers OS and dummy sidewalls DSW are formed on both side surfaces of the gate electrode GE. First, a silicon oxide film is formed by, for example, the CVD method so as to cover the gate insulating film GI, the gate electrode GE, and the cap film CP. Next, a silicon nitride film is formed on the silicon oxide film by, for example, the CVD method. Next, the silicon nitride film is processed by performing anisotropic etching process to the silicon nitride film, so that the dummy sidewall spacers DSW are formed on both side surfaces of the gate electrode GE via the silicon oxide film.

Next, isotropic etching is performed to the silicon oxide film exposed from the dummy sidewall spacers DSW, thereby removing the silicon oxide film on the cap film CP and the semiconductor layer SL. The silicon oxide films left between both side surfaces of the gate electrode GE and the dummy sidewall spacers DSW and between both side surfaces of the gate electrode GE and the semiconductor layer SL serve as the offset spacers OS.

Figure 9:
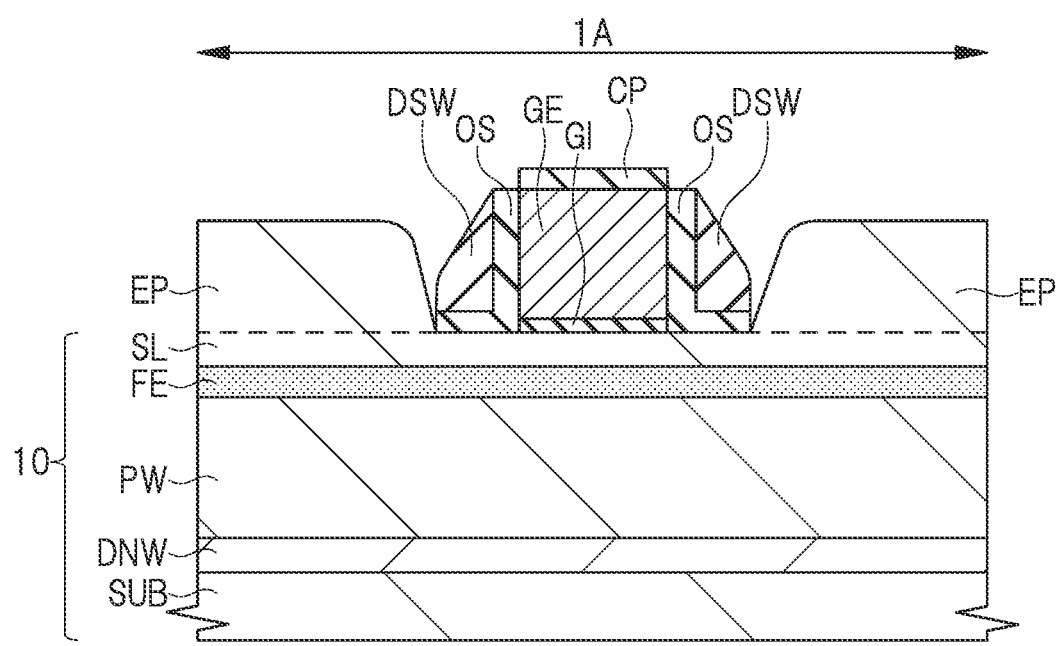
FIG. 9 is a cross-sectional view showing the manufacturing process subsequent to FIG. 8.

As shown in FIG. 9, the epitaxial layer EP is formed on the semiconductor layer SL. First, the surface of the semiconductor layer SL is cleaned with an aqueous solution containing hydrofluoric acid, an aqueous solution containing ammonia, or the like. Next, the epitaxial layer (semiconductor layer) EP made of, for example, single crystal silicon is formed on the semiconductor layer SL by the epitaxial growth method.

At this time, since the upper surface of the gate electrode GE is covered with the cap film CP and both side surfaces of the gate electrode GE are covered with the dummy sidewall spacers DSW, the epitaxial layer EP is not formed at these places. Note that the epitaxial layer EP is made of the same material as the semiconductor layer SL and is thus integrated with the semiconductor layer SL, but the boundary between the epitaxial layer EP and the semiconductor layer SL is shown by a broken line in order to facilitate understanding of the invention.

Figure 10:
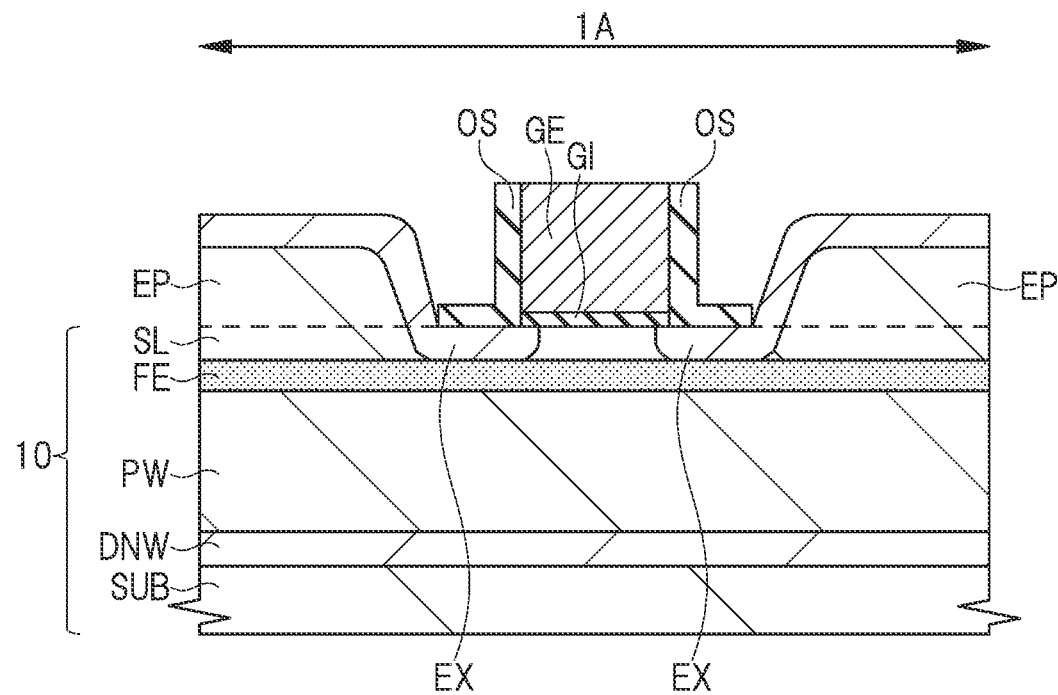
FIG. 10 is a cross-sectional view showing the manufacturing process subsequent to FIG. 9.

As shown in FIG. 10, after removing the cap film CP and the dummy sidewall spacers DSW, the extension regions EX are formed. First, the cap film CP and the dummy sidewall spacers DSW are selectively removed by anisotropic etching process. Next, the n-type extension regions EX are formed in the semiconductor layer SL and the epitaxial layer EP by the photolithography method and the ion implantation method.

Figure 11:
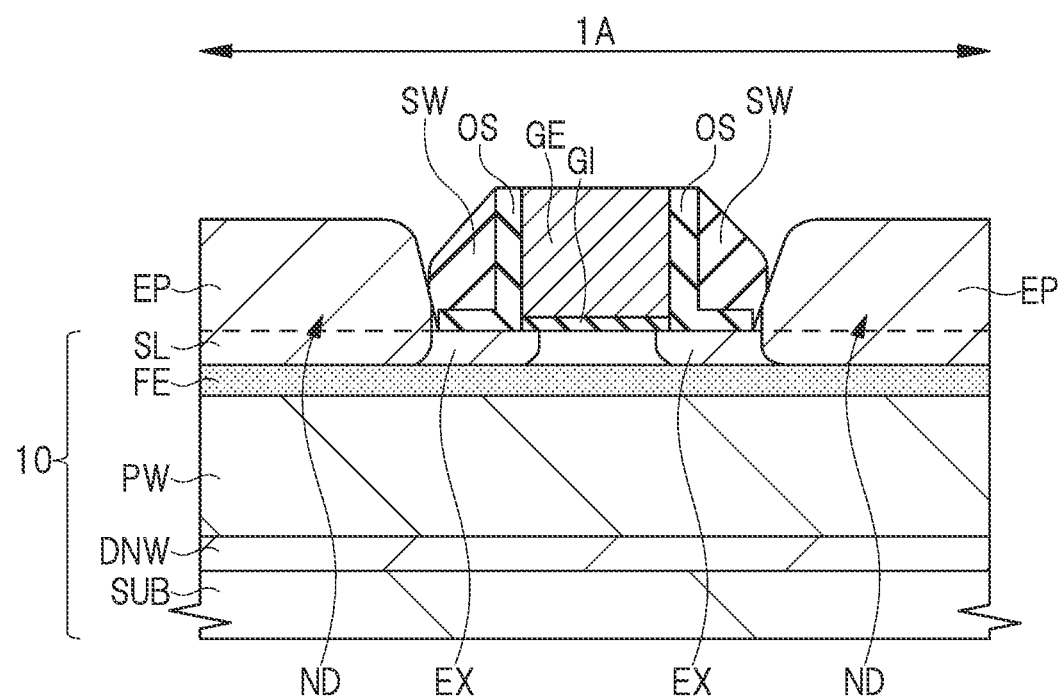
FIG. 11 is a cross-sectional view showing the manufacturing process subsequent to FIG. 10.

As shown in FIG. 11, the sidewall spacers SW and the diffusion regions ND are formed. First, a silicon nitride film is formed so as to cover the gate electrode GE by, for example, the CVD method. Next, by performing the anisotropic etching process to the silicon nitride film, the silicon nitride film is processed, and the sidewall spacers SW are formed on both side surfaces of the gate electrode GE via the offset spacers OS.

Next, the n-type diffusion regions ND are formed in the epitaxial layer EP and the semiconductor layer SL by the photolithography method and the ion implantation method. The diffusion region ND is connected to the extension region EX, and the diffusion region ND and the extension region EX form the source region or the drain region of the MISFET 1Q.

Thereafter, the MISFET 1Q shown in FIG. 1 is manufactured through the following steps. First, a metal film is formed so as to cover the gate electrode GE and the epitaxial layer EP. This metal film is made of, for example, cobalt, nickel, or nickel platinum alloy. Next, the first heat treatment at about 300° C. to 400° C. is performed to the semiconductor substrate SUB, and then the second heat treatment at about 600° C. to 700° C. is performed to make the diffusion regions ND and the gate electrode GE react with the metal film. As a result, the silicide layer SI is formed on the diffusion regions ND and on the gate electrode GE. Then, the unreacted metal film is removed.

(First Modification)

Hereinafter, a semiconductor device according to the first modification of the first embodiment will be described with reference to FIG. 12. In the following description, the differences from the first embodiment will be mainly described, and the description of the points overlapped with the first embodiment will be omitted.

Figure 12:
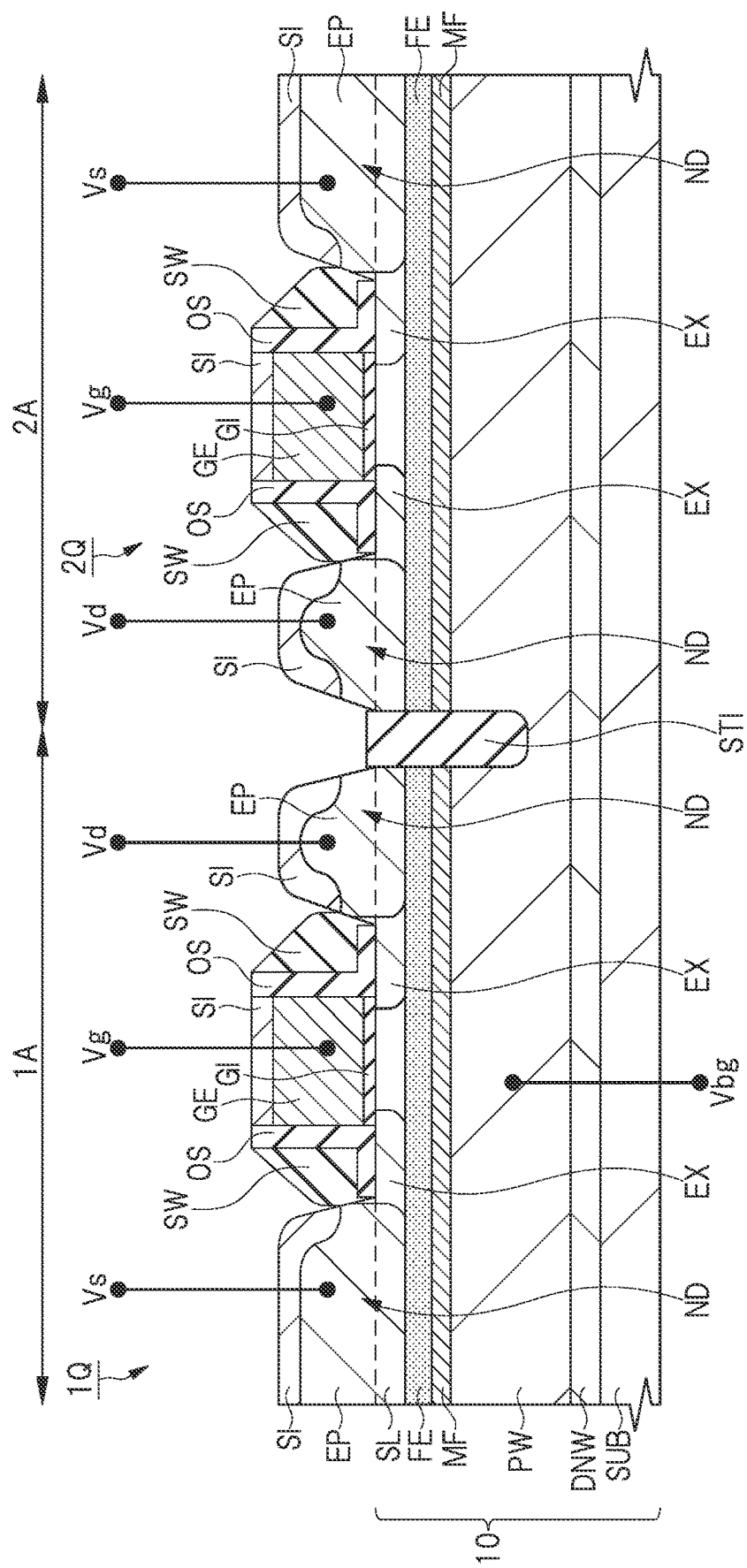
FIG. 12 is a cross-sectional view showing a semiconductor device according to the first modification.

In the first modification, as shown in FIG. 12, a metal film MF is formed between the ferroelectric layer FE and the semiconductor substrate SUB so as to be in direct contact with the ferroelectric layer FE. The metal film MF is, for example, a titanium nitride film, a tantalum nitride film, or a tungsten film. The thickness of the metal film MF is, for example, 2 nm to 4 nm.

As described in the first embodiment, the ferroelectric layer FE formed as an amorphous film is formed into an orthorhombic crystal by performing heat treatment thereto. At this time, the metal film MF can function to apply stress to the ferroelectric layer FE and control the crystal orientation of the ferroelectric layer FE. Therefore, by performing the above heat treatment in the state where the metal film MF is in contact with the ferroelectric layer FE, it becomes easy to maintain the state in which the ferroelectric layer FE is orthorhombic.

However, when the metal film MF is in contact with the ferroelectric layer FE, the influence of the polarization held in the ferroelectric layer FE may be propagated to the ferroelectric layer FE of another MISFET via the metal film MF. As a result, the threshold voltage set in the other MISFET may be varied from the set value.

Therefore, in the first modification, as shown in FIG. 12, the region 1A and the region 2A are partitioned by the element isolation portion STI, so that the ferroelectric layer FE and the metal film MF in the region 1A are separated from the ferroelectric layer FE and the metal film MF in the region 2A. As a result, the state in which the ferroelectric layer FE is orthorhombic can be maintained, and the possibility that the influence of the polarization held in the ferroelectric layer FE of the MISFET 1Q is propagated to the ferroelectric layer FE of the MISFET 2Q can be suppressed.

Note that the element isolation portion STI is composed of the trench formed in the semiconductor layer SL, the ferroelectric layer FE, and the semiconductor substrate SUB such that the bottom portion thereof is located in the semiconductor substrate SUB, and the insulating film embedded in the trench. The insulating film is, for example, a silicon oxide film.

(Second Modification)

Hereinafter, a semiconductor device according to the second modification of the first embodiment will be described with reference to FIG. 13 and FIG. 14. In the following description, the differences from the first embodiment will be mainly described, and the description of the points overlapped with the first embodiment will be omitted.

Figure 13:
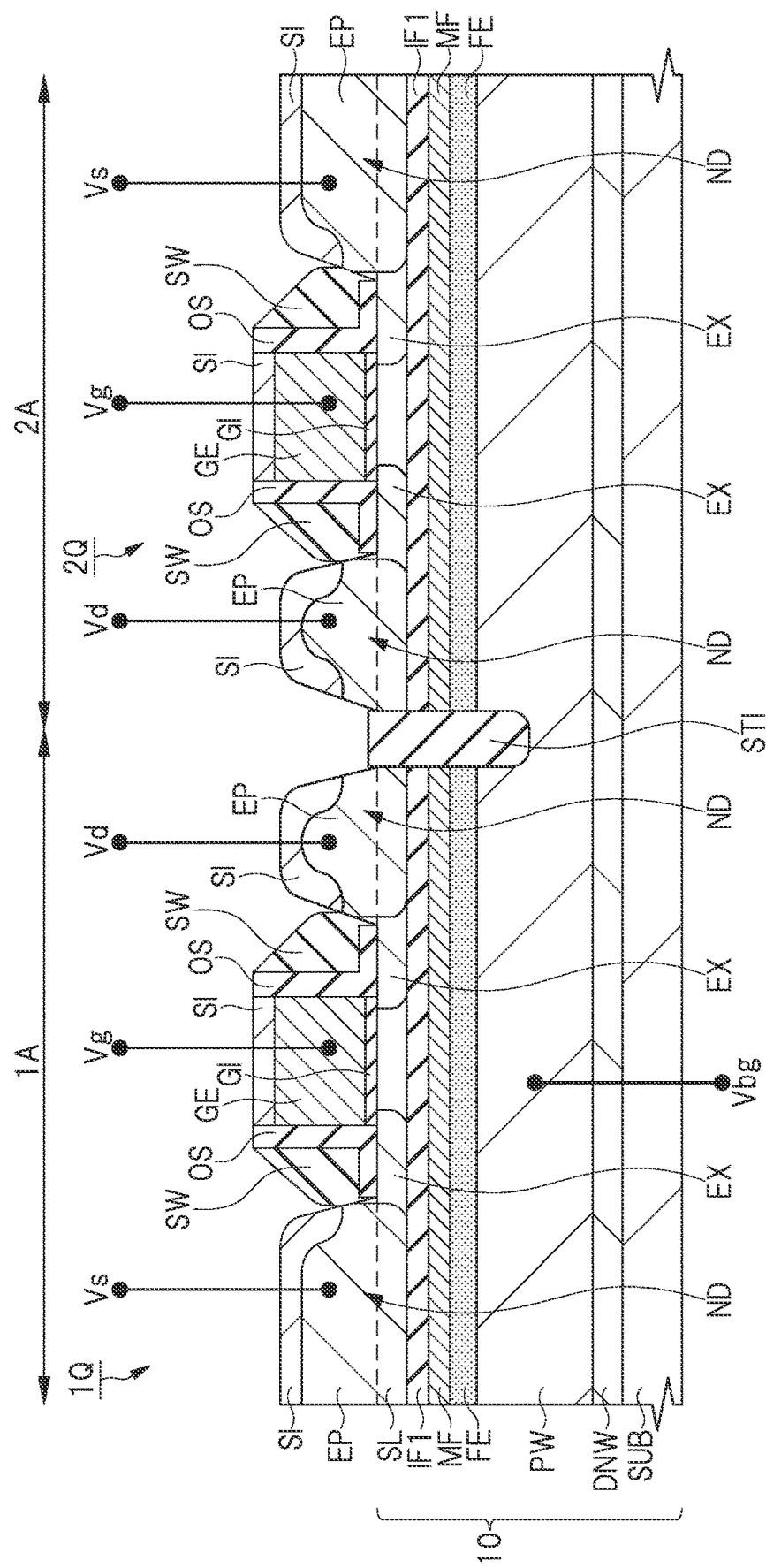
FIG. 13 is a cross-sectional view showing a semiconductor device according to the second modification.

In the second modification, as shown in FIG. 13, a metal film MF is formed between the ferroelectric layer FE and the semiconductor layer SL so as to be in direct contact with the ferroelectric layer FE. The metal film MF is made of the same material as that of the first modification, and has a function of maintaining the state in which the ferroelectric layer FE is orthorhombic as in the first modification. Further, also in the second modification, the region 1A and the region 2A are partitioned by the element isolation portion STI as in the first modification, and an insulating film IF1, the ferroelectric layer FE, and the metal film MF in the region 1A are separated from the insulating film IF1, the ferroelectric layer FE, and the metal film MF in the region 2A by the element isolation portion STI.

Further, in the second modification, the insulating film IF1 made of, for example, a silicon oxide film is formed between the metal film MF and the semiconductor layer SL. As a result, the metal film MF is electrically insulated from the semiconductor layer SL. Also, each of the metal film MF and the insulating film IF1 is set to have the thickness at which the magnitude of the polarization held in the ferroelectric layer FE affects the semiconductor layer SL to change the threshold voltage. The thickness of the metal film MF is, for example, 2 nm to 4 nm, and the thickness of the insulating film IF1 is, for example, 2 nm to 4 nm.

Figure 14:
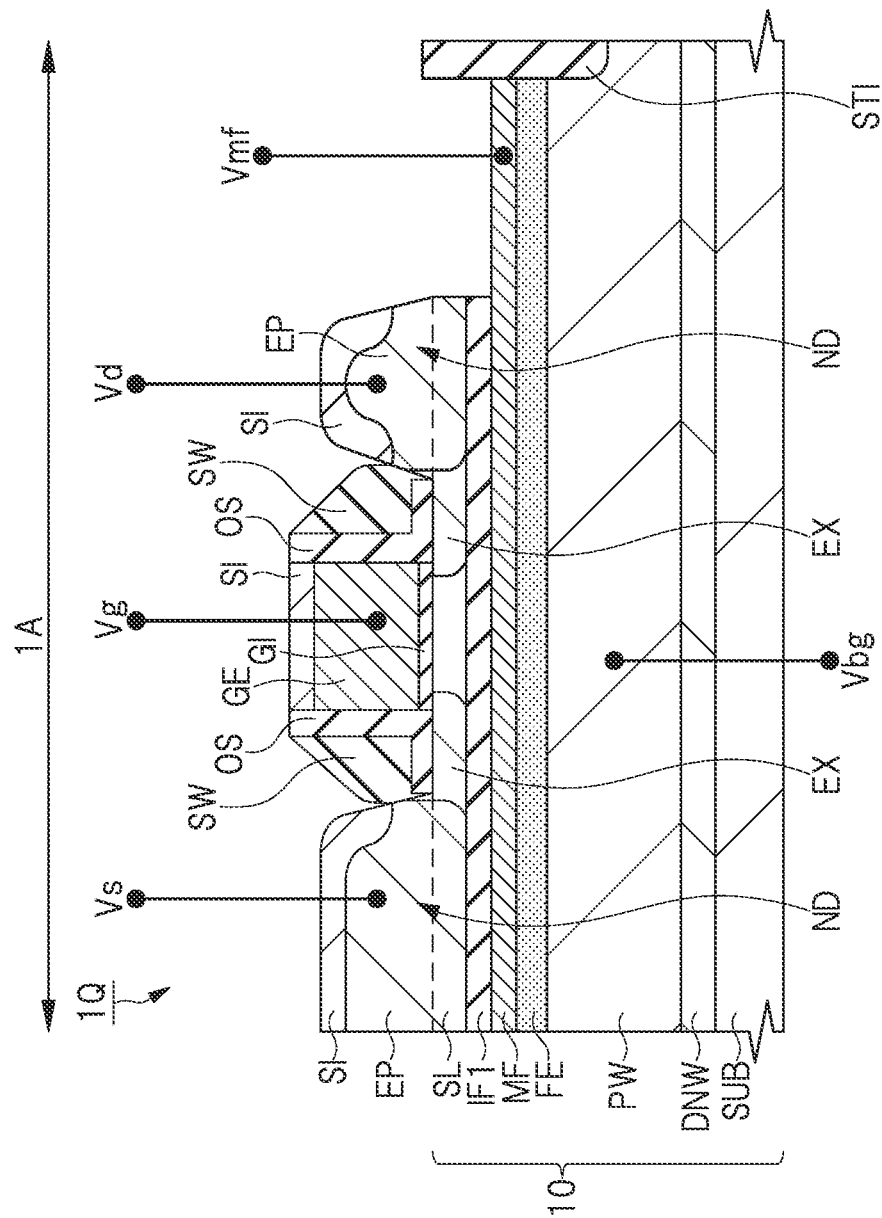
FIG. 14 is a cross-sectional view showing the semiconductor device according to the second modification.

Also, in the second modification, a region where the metal film MF is exposed may be provided by removing the semiconductor layer SL as shown in FIG. 14. Then, a plug that reaches the exposed metal film MF is provided in the interlayer insulating film. This makes it possible to apply a predetermined voltage Vmf to the metal film MF.

For example, by applying a positive electric field voltage (2 V) or a negative electric field voltage (−2 V) equivalent to that in FIG. 2 to the metal film MF, the magnitude of the polarization held at least in the ferroelectric layer FE located immediately below the gate electrode GE can be changed. Namely, the metal film MF is configured such that the magnitude of the polarization held at least in the ferroelectric layer FE located immediately below the gate electrode GE is changed by applying a positive electric field voltage or a negative electric field voltage to the metal film MF. More specifically, in the second modification, the magnitude of the polarization held in the entire ferroelectric layer FE in the region 1A changes.

As described above, in the second modification, the magnitude of the polarization held in the ferroelectric layer FE can be changed without applying a positive electric field voltage or a negative electric field voltage to the gate electrode DE, the source region, and the drain region. Therefore, it is not necessary to provide a switch circuit for switching to the positive electric field operation or the negative electric field operation other than the on-operation or the off-operation for the gate electrode DE, the source region, and the drain region.

In the foregoing, the present invention has been specifically described above based on the embodiments, but the present invention is not limited to the above-described embodiments and can be variously modified within the scope not departing from the gist thereof.

For example, in the embodiment above, the n-type MISFET has been described, but the threshold value of the p-type MISFET can be adjusted by changing the magnitude of the polarization held in the ferroelectric layer FE even for the p-type MISFET.

Further, in the above embodiment, the case in which the thickness of the ferroelectric layer FE constituting the MISFET 1Q is, for example, about 4 nm to 15 nm has been described. However, if a relatively large voltage value is applied to each region of the gate electrode, the source region, and the drain region constituting the MISFET 1Q in the case in which the thickness of the ferroelectric layer FE is relatively thin, a leakage current may be generated. Therefore, when a relatively large voltage value is applied to each region, it is more preferable that the lower limit of the thickness of the ferroelectric layer FE is set to about 8 nm.

What is claimed is:

1. A semiconductor device comprising:
    an SOI substrate comprising:
        a semiconductor substrate;
        a ferroelectric layer formed on the semiconductor substrate; and
        a semiconductor layer formed on the ferroelectric layer,
    wherein the SOI substrate has a first region in which a first MISFET is formed,
    wherein the first MISFET includes:
        the semiconductor substrate in the first region;
        the ferroelectric layer in the first region;
        the semiconductor layer in the first region;
        a first gate insulating film formed on the semiconductor layer in the first region;
        a first gate electrode formed on the first gate insulating film;
        a first source region located on one side of the first gate electrode and formed in the semiconductor layer in the first region; and
        a first drain region located on another side of the first gate electrode and formed in the semiconductor layer in the first region.

2. The semiconductor device according to claim 1, wherein the ferroelectric layer in the first region is configured such that a threshold voltage of the first MISFET is changed depending on a magnitude of polarization held in the ferroelectric layer.

3. The semiconductor device according to claim 2,
    wherein at least the ferroelectric layer located immediately below the first gate electrode is configured such that the magnitude of the polarization held in the ferroelectric layer is changed by applying a positive electric field voltage or a negative electric field voltage to each of the first gate electrode, the first source region and the first drain region, wherein the positive electric field voltage to be applied to the first gate electrode, the positive electric field voltage to be applied to the first source region, and the positive electric field voltage to be applied to the first drain region are the same as each other, and wherein the negative electric field voltage to be applied to the first gate electrode, the negative electric field voltage to be applied to the first source region, and the negative electric field voltage to be applied to the first drain region are the same as each other.

4. The semiconductor device according to claim 2, wherein the SOI substrate further has a second region which is different from the first region and in which a second MISFET is formed, wherein the second MISFET includes:
the semiconductor substrate in the second region;
the ferroelectric layer in the second region;
the semiconductor layer in the second region;
a second gate insulating film formed on the semiconductor layer in the second region;
a second gate electrode formed on the second gate insulating film;
a second source region located on one side of the second gate electrode and formed in the semiconductor layer in the second region; and
a second drain region located on another side of the second gate electrode and formed in the semiconductor layer in the second region, wherein a threshold voltage of the second MISFET is adjusted depending on a magnitude of polarization held in the ferroelectric layer in the second region, and wherein the magnitude of the polarization held in the ferroelectric layer in the first region and the magnitude of the polarization held in the ferroelectric layer in the second region can be set individually.

5. The semiconductor device according to claim 4, wherein the magnitude of the polarization held in the ferroelectric layer in the first region is different from the magnitude of the polarization held in the ferroelectric layer in the second region.

6. The semiconductor device according to claim 5,
wherein a voltage applied to the first gate electrode in each of an on-operation of the first MISFET and an off-operation of the first MISFET is the same as a voltage applied to the second gate electrode in each of an on-operation of the second MISFET and an off-operation of the second MISFET, wherein a voltage applied to the first source region in each of the on-operation of the first MISFET and the off-operation of the first MISFET is the same as a voltage applied to the second source region in each of the on-operation of the second MISFET and the off-operation of the second MISFET, and wherein a voltage applied to the first drain region in each of the on-operation of the first MISFET and the off-operation of the first MISFET is the same as a voltage applied to the second drain region in each of the on-operation of the second MISFET and the off-operation of the second MISFET.

7. The semiconductor device according to claim 4, further comprising an element isolation portion composed of a trench formed in the semiconductor layer, the ferroelectric layer and the semiconductor substrate such that a bottom portion of the trench is located in the semiconductor substrate, and a first insulating film embedded in the trench,
wherein the first region and the second region are partitioned by the element isolation portion,
wherein a first metal film is formed between the ferroelectric layer and the semiconductor substrate so as to be in direct contact with the ferroelectric layer, and
wherein the ferroelectric layer in the first region and the first metal film in the first region are separated from the ferroelectric layer in the second region and the first metal film in the second region by the element isolation portion.

8. The semiconductor device according to claim 4, further comprising an element isolation portion composed of a trench formed in the semiconductor layer, the ferroelectric layer and the semiconductor substrate such that a bottom portion of the trench is located in the semiconductor substrate, and a first insulating film embedded in the trench,
wherein the first region and the second region are partitioned by the element isolation portion,
wherein a second metal film is formed between the ferroelectric layer and the semiconductor layer so as to be in direct contact with the ferroelectric layer,
wherein a second insulating film is formed between the second metal film and the semiconductor layer, and
wherein the ferroelectric layer in the first region, the second metal film in the first region, and the second insulating film in the first region are separated from the ferroelectric layer in the second region, the second metal film in the second region and the second insulating film in the second region by the element isolation portion.

9. The semiconductor device according to claim 1, wherein a first metal film is formed between the ferroelectric layer and the semiconductor substrate so as to be in direct contact with the ferroelectric layer.

10. The semiconductor device according to claim 1,
wherein a second metal film is formed between the ferroelectric layer and the semiconductor layer so as to be in direct contact with the ferroelectric layer, and
wherein a second insulating film is formed between the second metal film and the semiconductor layer.

11. The semiconductor device according to claim 10, wherein the second metal film is configured such that a magnitude of polarization held in at least the ferroelectric layer located immediately below the first gate electrode is changed by applying a positive electric field voltage or a negative electric field voltage to the second metal film.

12. The semiconductor device according to claim 1, wherein the ferroelectric layer contains hafnium, zirconium and oxygen, and is an orthorhombic crystal.

* * * * *